United States Patent
Yan et al.

(10) Patent No.: US 9,087,716 B2
(45) Date of Patent: Jul. 21, 2015

(54) CHANNEL SEMICONDUCTOR ALLOY LAYER GROWTH ADJUSTED BY IMPURITY ION IMPLANTATION

(71) Applicant: GLOBALFOUNDRIES Inc., Grand Cayman, KY (US)

(72) Inventors: Ran Yan, Dresden (DE); Joerg Schoenekess, Radebeul (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/942,034

(22) Filed: Jul. 15, 2013

(65) Prior Publication Data
US 2015/0014777 A1    Jan. 15, 2015

(51) Int. Cl.
| | |
|---|---|
| H01L 21/8238 | (2006.01) |
| H01L 27/088 | (2006.01) |
| H01L 29/66 | (2006.01) |
| H01L 21/8234 | (2006.01) |
| H01L 21/84 | (2006.01) |
| H01L 27/092 | (2006.01) |

(52) U.S. Cl.
CPC ...... *H01L 27/088* (2013.01); *H01L 21/823412* (2013.01); *H01L 21/823807* (2013.01); *H01L 21/84* (2013.01); *H01L 27/092* (2013.01); *H01L 29/66477* (2013.01)

(58) Field of Classification Search
CPC ............ H01L 29/167; H01L 21/28255; H01L 21/765855; H01L 29/66477; G11C 20/86; H11C 29/816
USPC .......................................... 438/233; 257/377
See application file for complete search history.

(56) References Cited

U.S. PATENT DOCUMENTS

| | | | | |
|---|---|---|---|---|
| 5,696,016 | A  * | 12/1997 | Chen et al. | 438/199 |
| 5,908,313 | A  * | 6/1999 | Chau et al. | 438/299 |
| 6,417,041 | B1 * | 7/2002 | Ibok | 438/240 |
| 6,503,773 | B2 * | 1/2003 | Fitzgerald | 438/37 |
| 6,515,335 | B1 * | 2/2003 | Christiansen et al. | 257/347 |
| 6,555,880 | B2 * | 4/2003 | Cabral et al. | 257/384 |
| 6,806,145 | B2 * | 10/2004 | Haukka et al. | 438/287 |

(Continued)

OTHER PUBLICATIONS

Li et al "SiGe gate oxide prepared at low-temperatures in an electron cyclotron resonance plasma", Appl. Phys . Lett. vol. 63, No. 21 (Nov. 1993) pp. 2938-2940.*
Ernst et al "High mobility nano-scaled CMOS: some opportunities and challenges", SiGe Technology and Device Meeting (2006) ISTDM 2006 Third International Conference pp. 1-2, IEEE Conf. Publications (2 pages).*

*Primary Examiner* — Caridad Everhart
(74) *Attorney, Agent, or Firm* — Amerson Law Firm, PLLC

(57) ABSTRACT

The present disclosure provides an improved method for forming a thin semiconductor alloy layer on top of a semiconductor layer. The proposed method relies on an implantation of appropriate impurity species before performing deposition of the semiconductor alloy film. The implanted species cause the semiconductor alloy layer to be less unstable to wet and dry etches performed on the device surface after deposition. Thus, the thickness uniformity of the semiconductor alloy film may be substantially increased if the film is deposited after performing the implantation. On the other hand, some implanted impurities have been found to decrease the growth rate of the semiconductor alloy layer. Thus, by selectively implanting appropriate impurities in predetermined portions of a wafer, a single deposition step may be used in order to form a semiconductor alloy layer with a thickness which may be locally adjusted at will.

24 Claims, 12 Drawing Sheets

(56) References Cited

U.S. PATENT DOCUMENTS

| | | | |
|---|---|---|---|
| 2004/0262683 A1* | 12/2004 | Bohr et al. | 257/338 |
| 2005/0056352 A1* | 3/2005 | Bedell et al. | 148/537 |
| 2006/0105518 A1* | 5/2006 | Kohli et al. | 438/231 |
| 2006/0234455 A1* | 10/2006 | Chen et al. | 438/276 |
| 2008/0258134 A1* | 10/2008 | Mears et al. | 257/15 |
| 2010/0013021 A1* | 1/2010 | Chen et al. | 257/369 |
| 2010/0184260 A1* | 7/2010 | Luo et al. | 438/154 |
| 2014/0099758 A1* | 4/2014 | Chuang et al. | 438/199 |
| 2014/0113459 A1* | 4/2014 | Kaufman-Osborn et al. | 438/796 |

* cited by examiner

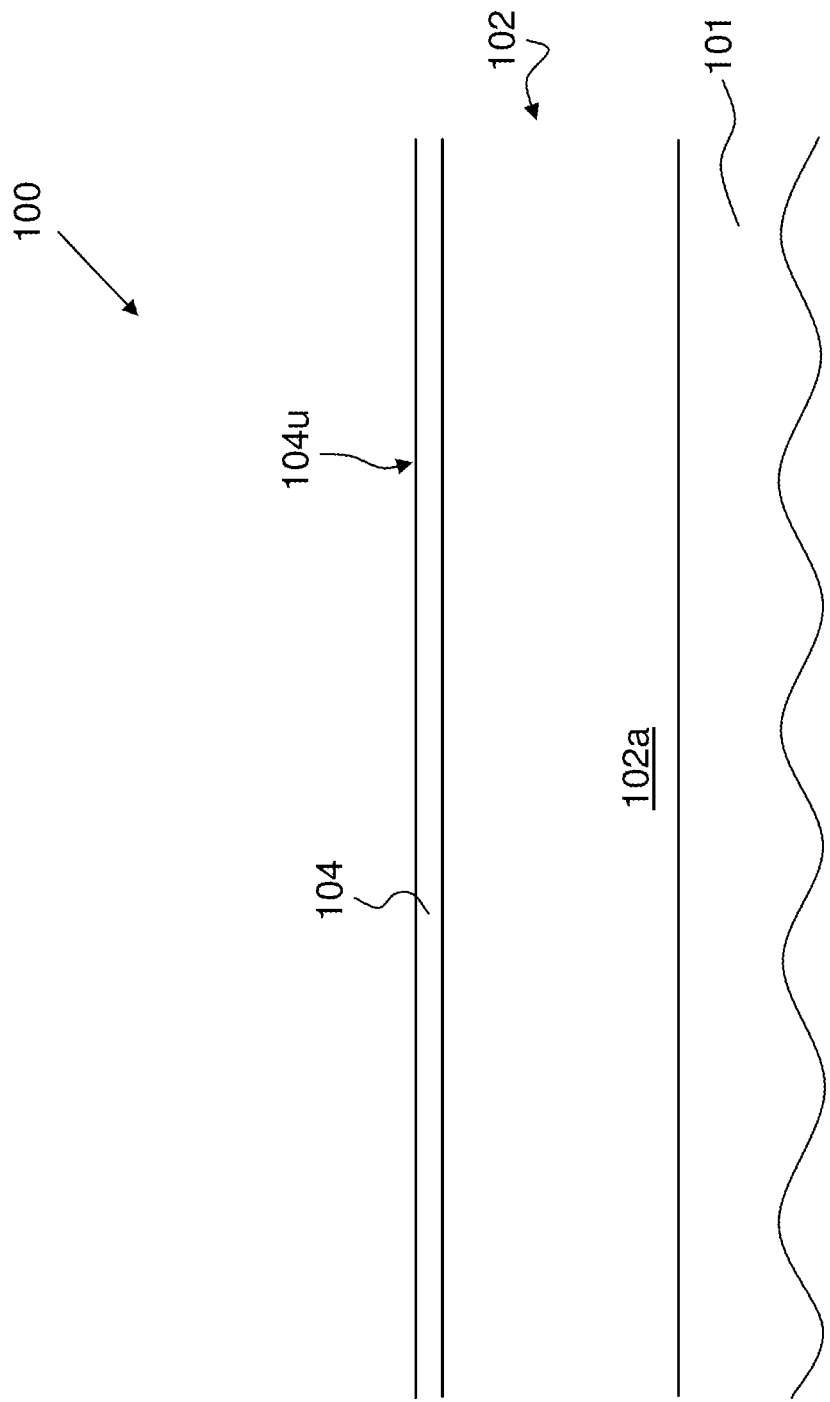

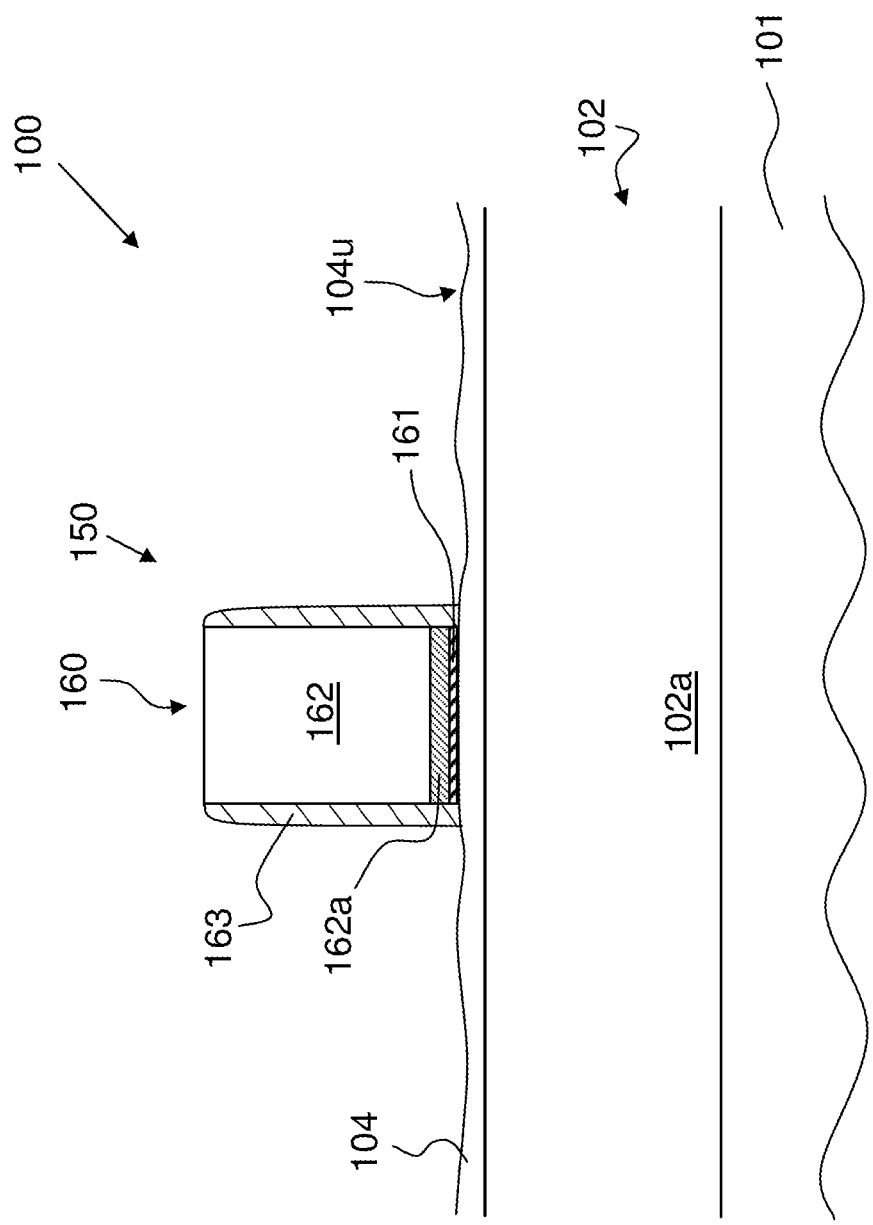

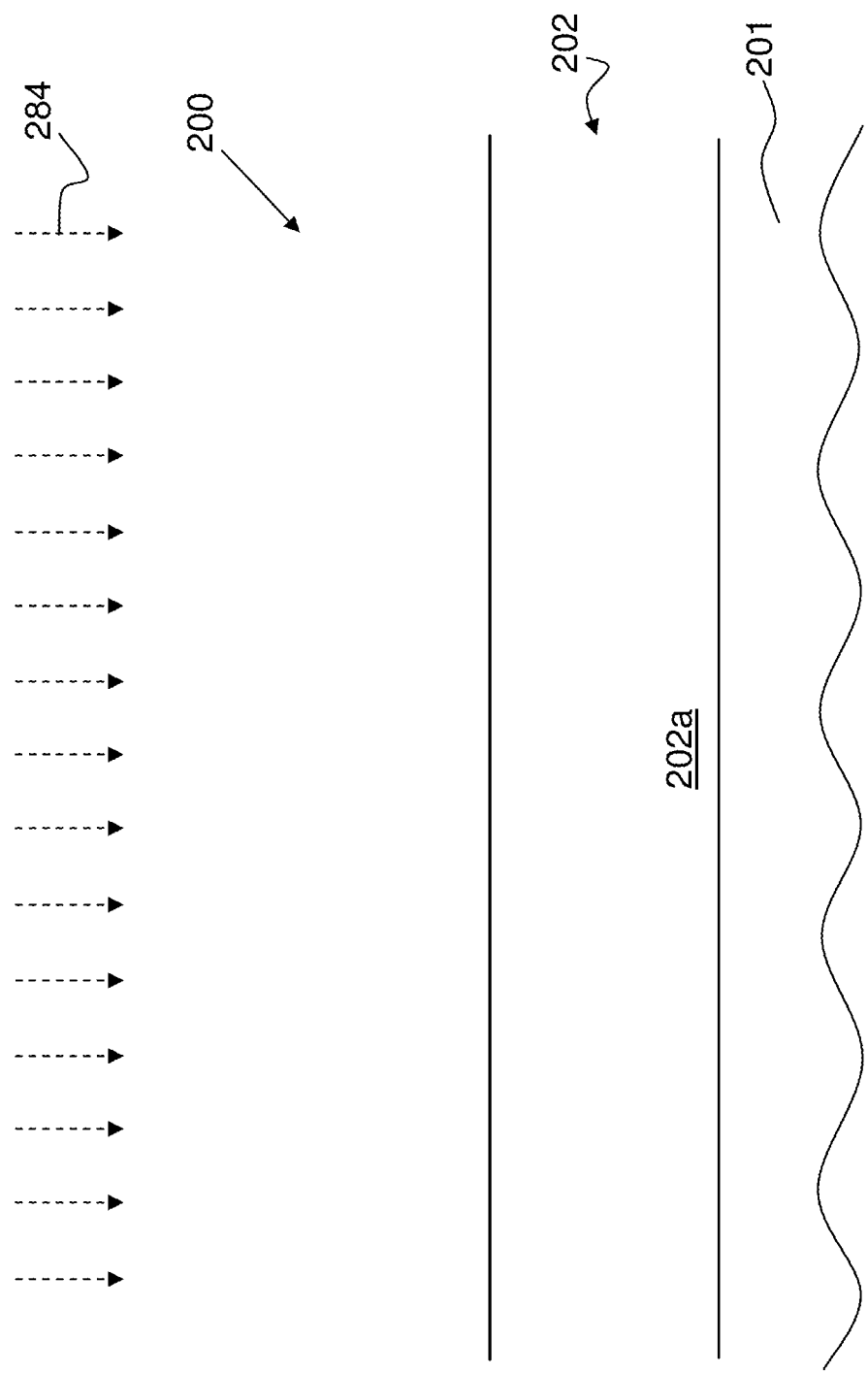

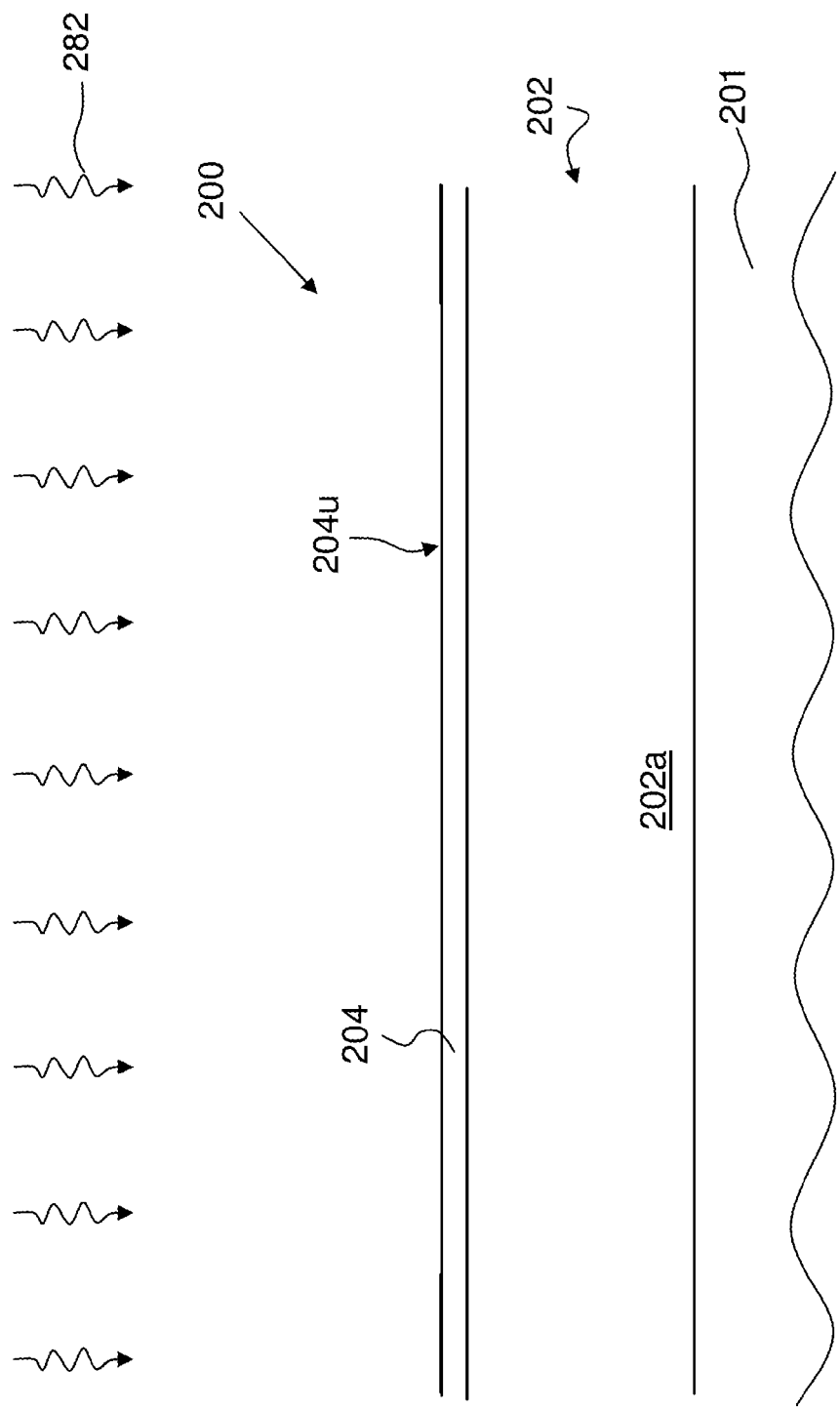

CHANNEL SEMICONDUCTOR ALLOY LAYER GROWTH ADJUSTED BY IMPURITY ION IMPLANTATION

BACKGROUND OF THE INVENTION

1. Field of the Invention

Generally, the present disclosure relates to integrated circuits, and, more particularly, to transistors comprising a silicon/germanium alloy layer deposited onto the surface of the active region of the transistor.

2. Description of the Related Art

The ongoing trend in electronics towards more and more complex integrated circuits requires the dimensions of electronic devices to decrease in order to achieve a higher and higher integration density.

Transistors are the dominant circuit elements in current integrated circuits. Currently, several hundred millions of transistors may be provided in presently available complex integrated circuits such as microprocessors, CPUs, storage chips and the like. It is then crucial that the typical dimensions of the transistors included in an integrated circuit are as small as possible, so as to enable a high integration density.

Transistors are usually formed in active regions defined within a semiconductor layer supported by a substrate. Presently, the layer in which most integrated circuits are formed is made out of silicon, which may be provided in crystalline, polycrystalline or amorphous form. Other materials such as, for example, dopant atoms or ions may be introduced into the original semiconductor layer.

A metal-oxide-semiconductor field effect transistor (MOSFET) or generally a field effect transistor (FET), irrespective of whether an N-channel transistor or a P-channel transistor is considered, comprises a source and a drain region, highly doped with dopants of the same species. An inversely or weakly doped channel region is then arranged between the drain and the source regions. The conductivity of the channel region, i.e., the drive current capability of the conductive channel, may be controlled by a gate electrode formed in the vicinity of the channel region and separated therefrom by a thin insulating layer. The conductivity of the channel region depends on, among other things, the mobility of the charge carriers and the distance along the transistor width direction between the source and drain regions, which is also referred to as channel length. For example, by reducing the channel length, the channel resistivity decreases. Thus, an increased switching speed and higher drive current capabilities of a transistor may be achieved by decreasing the transistor channel length.

When fabricating transistors with typical gate dimensions below 50 nm, the so-called "high-k/metal gate" (HKMG) technology has by now become the new manufacturing standard. According to the HKMG manufacturing process flow, the insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices. By high-k material it is referred to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

HKMG enables increasing the thickness of the insulation layer in the gate electrode, thereby significantly reducing leakage currents through the gate, even at transistor channel typical sizes as low as 30 nm or smaller. However, implementation of HKMG brings about new technological challenges and requires new integration schemes with respect to the conventional poly/SiON technology.

For example, new materials have to be found in order to tune the work function of gate electrode species, so as to adjust the transistor threshold voltage to a desired level. A thin "work function metal" layer is inserted for this purpose between the high-k dielectric and the gate material placed above the high-k dielectric. The threshold voltage may thus be adjusted by varying the thickness of the metal layer.

Currently, two different schemes exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages such as dopant ion implantation, source and drain region formation and substrate silicidation are performed in the presence of a sacrificial dummy gate. The dummy gate is replaced by the real gate after the high-temperature source/drain formation and all silicide annealing cycles have been carried out.

In order to further tune the transistor threshold voltage, an epitaxial semiconductor alloy film is introduced in the transistor channel region. The epitaxial semiconductor alloy film is particularly advantageous for reducing the threshold voltage when using the gate-first HKMG approach. In the case of silicon-based devices, this semiconductor alloy film is typically implemented as a silicon/germanium (SiGe) alloy thin film epitaxially grown onto a portion of the substrate surface included in the channel region. An SiGe layer or, in general, a semiconductor alloy layer formed as described above will be hereinafter referred to as a "channel SiGe layer" or "channel semiconductor alloy layer," respectively.

FIG. 1a shows a cross-sectional view of a semiconductor structure 100 during an early stage of the fabrication process. As shown, the device 100 comprises a substrate 101, such as a semiconductor material and the like, above which a semiconductor layer 102 is formed. The semiconductor layer 102 is typically made of a silicon single crystal. The semiconductor layer 102 is laterally divided into a plurality of active regions 102a, which are to be understood as semiconductor regions in and above which one or more transistors are to be formed. For convenience, a single active region 102a is illustrated. Separation regions not shown in the figures might laterally delimit active regions 102a. Separation regions may, for example, be implemented as shallow trench isolations.

Depending on the overall device requirements, the substrate 101 and the semiconductor layer 102, for instance initially provided as a silicon material, may form an SOI (silicon-on-insulator) architecture when a buried insulating material (not shown) is formed directly below the semiconductor layer 102. In other cases, initially the semiconductor layer 102 represents a part of the crystalline material of the substrate 101 when a bulk configuration is to be used for the device 100.

A semiconductor alloy layer 104, typically an SiGe layer, lies on top of the upper surface of the semiconductor layer 102. In particular, the semiconductor alloy layer 104 is typically formed by means of a deposition process on the upper surface of the silicon layer 102 within the active region 102a.

The semiconductor alloy layer 104 exposes its upper surface 104*u* to the outside. The semiconductor alloy layer 104 is formed onto the semiconductor layer 102 so that a portion thereof will be included in the channel region of a transistor to be formed partly in and partly on the semiconductor layer 102. Thus, the semiconductor alloy 104 is a channel semiconductor alloy layer.

It is here pointed out that, in some approaches, the semiconductor alloy layer 104 is formed after defining the active region 102*a* and separation regions. On the other hand, in other approaches, an early deposition of the semiconductor alloy layer 104 onto the surface of the semiconductor layer 102 may be preferred, followed by the definition of the active region 102*a* and, where required, of the separation regions.

As shown in FIG. 1*b*, a cleaning process 182 typically follows the formation of the channel semiconductor alloy layer 104. The cleaning process 182 is crucial in order to form a good quality gate oxide on the surface of the semiconductor layer 104.

The cleaning process 182 may include a wet etch. The wet etch may include using one or more acids. For example, hydrofluoric acid (HF) may be used. The wet etch may also be performed using a solvent. For example, acetone or methanol may be used. Furthermore, wet etch may include using a solution of a hydroxide in water. Alternatively or additionally, the cleaning process 182 may include a dry etch. For example, an etch based on a plasma may be used.

During cleaning 182, the semiconductor structure 100 exposes the upper surface 104*u* of the semiconductor alloy layer 104. As it turns out, the upper surface 104*u* of the semiconductor alloy layer 104 is extremely unstable and is likely damaged or eroded by cleaning 182, particularly when the semiconductor alloy layer 104 is comprised of an SiGe alloy. Usually, the extent to which surface 104*u* is eroded or etched by cleaning 182 is not uniform across the whole device surface. Rather, the semiconductor alloy layer 104 may likely be eroded by the cleaning process 182 to different extents depending on the position across the layer surface. As a consequence, the semiconductor alloy layer 104 has different thicknesses depending on the layer portion. As will be explained in the following, this feature of the semiconductor alloy layer 104 is undesirable since the threshold voltage of a FET is extremely sensitive to the thickness of the channel semiconductor alloy layer 104. A pronounced thickness fluctuation of the layer 104 may then result in two FETs fabricated in different areas of the same device having different threshold voltages, or even in the threshold voltage of a single FET not being clearly defined as designed.

FIG. 1*c* shows a cross-section of the semiconductor structure 100 in a fabrication stage subsequent to that shown in FIG. 1*b*. A transistor 150 has been partly formed in and on top of the active region 102*a* of the semiconductor layer. In particular, a gate electrode structure 160 has been formed on the semiconductor layer 102. The gate electrode structure 160 has been formed on the channel semiconductor alloy layer 104 and, more specifically, on the upper surface 104*u* of the channel semiconductor alloy layer 104.

The gate electrode 160 comprises a gate electrode material 162, which may be, for example, polysilicon. The gate electrode 160 may have any appropriate geometric configuration, for instance in terms of length and width. For example, the gate length, i.e., in FIG. 1*c*, the horizontal extension of the gate electrode material 162, may be 50 nm and less. An insulation layer 161 physically and electrically separates the gate electrode material 162 from the channel region of the transistor 150.

The gate structure 160 may have been formed according to an HKMG approach. HKMG technology is usually preferred for gate lengths of about 50 nm or smaller. In this case, the insulation layer 161 may be one of the high-k gate dielectric materials well known in the art. For example, a non-exhaustive list of high-k materials which may be used in transistor gates has been given above.

The gate electrode structure 160 may also comprise a gate metal layer 162*a*, for instance in the form of tantalum nitride and the like, possibly in combination with a work function metal species, such as aluminum and the like. The gate metal layer 162*a* is typically formed above the insulation layer 161, thereby adjusting an appropriate work function and thus threshold voltage of the transistor 150. Furthermore, the gate electrode structure may be laterally delimited by a spacer structure 163 which may comprise one or more dielectric materials such as, for example, silicon nitride, silicon dioxide, silicon oxynitride and the like. For example, the spacer structure 163 may comprise appropriate protective liner materials for laterally encapsulating sensitive gate materials, such as the insulation layer 161 and, in particular, the metal layer 162*a*.

The device fabrication flow may then continue in a conventional manner by performing the subsequent operations which might include: one or more than one ion implantations performed so as to define the source and drain regions of the FET, one or more silicidation steps, and deposition of one or more insulating layers onto the device surface.

As said above, the thickness of the channel semiconductor alloy layer is a crucial parameter affecting the threshold voltage of a FET and, especially, of a P-channel FET. For example, when SiGe alloy layers are used, the concentration of Ge in the film typically depends on the film thickness. In general, the different thicknesses of the semiconductor layer may critically affect the transistor threshold voltage due to the variation of band structure and of band-gap with respect to the film thickness.

In order for the threshold voltage to assume one and the same value for all transistors included in the semiconductor device, it is necessary that the thickness of the channel semiconductor alloy layer is uniform across the whole device surface.

Two main factors affect the uniformity of the channel semiconductor alloy layer, namely, the quality of the deposition process and the cleaning steps performed on the device surface after the layer deposition.

Fluctuations in the thickness of the channel semiconductor alloy layer straight after the deposition may be reduced to a minimum by using a highly conformal deposition technique. Several attempts have been made in this direction, achieving semiconductor alloy layers, e.g., SiGe alloy layers, with satisfactory thickness uniformity upon deposition.

However, the device surface, for example the wafer surface, typically undergoes one or more cleaning steps after the channel semiconductor alloy layer has been deposited. These cleaning steps may include wet or dry etches, as said above. The semiconductor alloy layer turns out to be particularly sensitive to the etching caused by the cleaning. Thus, as a result of surface cleaning, a pronounced thickness fluctuation is observed across the channel semiconductor alloy layer.

One more problem is the variation of thickness of the semiconductor alloy layer depending on the particular area of the device surface. Even if one well-established and highly conformal growing method is used, the channel semiconductor alloy layer turns out to have different thicknesses in different device areas. This thickness variation depends mainly on the fact that active regions formed in different device areas generally extend by different widths, thus having different surface areas. For instance, due to the small island size, transistors formed in a device area corresponding to a static random access memory (SRAM) area typically have a channel semiconductor alloy layer about 3 nm thicker than a transistor formed in an area occupied by a central processing unit (CPU).

This effect, also known as "pull-up issue" or "mushroom head," is due to the inter-action between the deposited semiconductor alloy, e.g., SiGe, with the edges of the separation regions delimiting the active regions. Let us suppose that the surface of the substrate onto which the semiconductor alloy layer is deposited lies on a horizontal plane. Usually, the portion of the semiconductor alloy layer lying in proximity to the boundary between an active region and an isolation region forms a bump resulting in a portion of the layer with a larger thickness than the average layer thickness. The portion with an increased thickness extends across the horizontal plane towards the center of the active region by a certain length. If the active region extends across the horizontal plane by a length or a width that are comparable to or less than the length of the layer portion including the bump, then bumps originated from different points along the boundary of the active regions may interact with each other. In particular, bumps formed from different points of the active region boundary might overlap, thus resulting in a bulge of the semiconductor alloy layer at a central position across the surface of the active area.

The thickness variation of the semiconductor alloy layer cannot be compensated for by depositing a semiconductor layer with different thicknesses depending on the area across the surface. Since channel semiconductor alloy layers are processed at the wafer level, it is generally not possible to adjust the thickness of the semiconductor alloy layer depending on the particular device area onto which it is formed. Conversely, a channel semiconductor alloy layer, for example a channel SiGe layer, has to be grown in the course of a single deposition process, wherein the thickness cannot be locally controlled with respect to the position on the wafer. This means that, unless a deposition mask is used, a channel semiconductor alloy layer can only be formed by uniformly depositing the same amount of material across the entire wafer surface. This results in a variable thickness of the deposited layer depending on the local geometry of the device.

Therefore, a method is desirable which allows one to grow channel semiconductor alloy layers with a uniform thickness not changing upon device cleaning. It is also desirable to have the option of locally adjusting the thickness of the channel semiconductor alloy layer depending on the particular device area, even when the channel semiconductor alloy layer is deposited by means of a single-step process.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is based on the inventive idea that, when epitaxially growing an SiGe alloy film onto a crystalline silicon surface, a certain amount of impurity species in the silicon may affect the SiGe growth and stability. In particular, the present invention is based on the inventive idea of implanting impurity species in a silicon layer before epitaxially forming an SiGe alloy film, so as to adjust the SiGe film growth rate and provide the grown SiGe film with higher toughness against erosion and etch caused by subsequent cleaning procedures.

Based on these ideas, a method of forming a transistor structure is provided. The method includes providing a semiconductor layer, implanting impurity ions into the semiconductor layer and forming a semiconductor alloy layer onto the surface of the semiconductor layer after performing the impurity ion implantation.

According to one embodiment, the method includes annealing the transistor structure after implanting the impurity ions and before forming the semiconductor alloy layer. Annealing after implantation allows the semiconductor layer to re-crystallize after implantation-induced damage.

According to one embodiment, the species implanted before deposition of the semiconductor alloy layer are neutral species. According to a particular embodiment, the implanted species comprise at least one of xenon, argon and germanium.

According to a further embodiment of the present invention, before forming the semiconductor alloy layer, one or more species may be implanted which are capable of varying the threshold voltage of the transistor. In particular, according to one embodiment of the invention, at least one of fluorine or nitrogen may be implanted.

BRIEF DESCRIPTION OF THE DRAWINGS

The disclosure may be understood by reference to the following description taken in conjunction with the accompanying drawings, in which like reference numerals identify like elements, and in which:

FIGS. 1a-1c schematically illustrate cross-sectional views of a semiconductor structure comprising a transistor during subsequent stages of a fabrication process flow according to the prior art;

FIGS. 2a-2e schematically illustrate cross-sectional views of a semiconductor structure during subsequent manufacturing stages of a fabrication process flow according to one embodiment of the present invention;

Figure 1B:
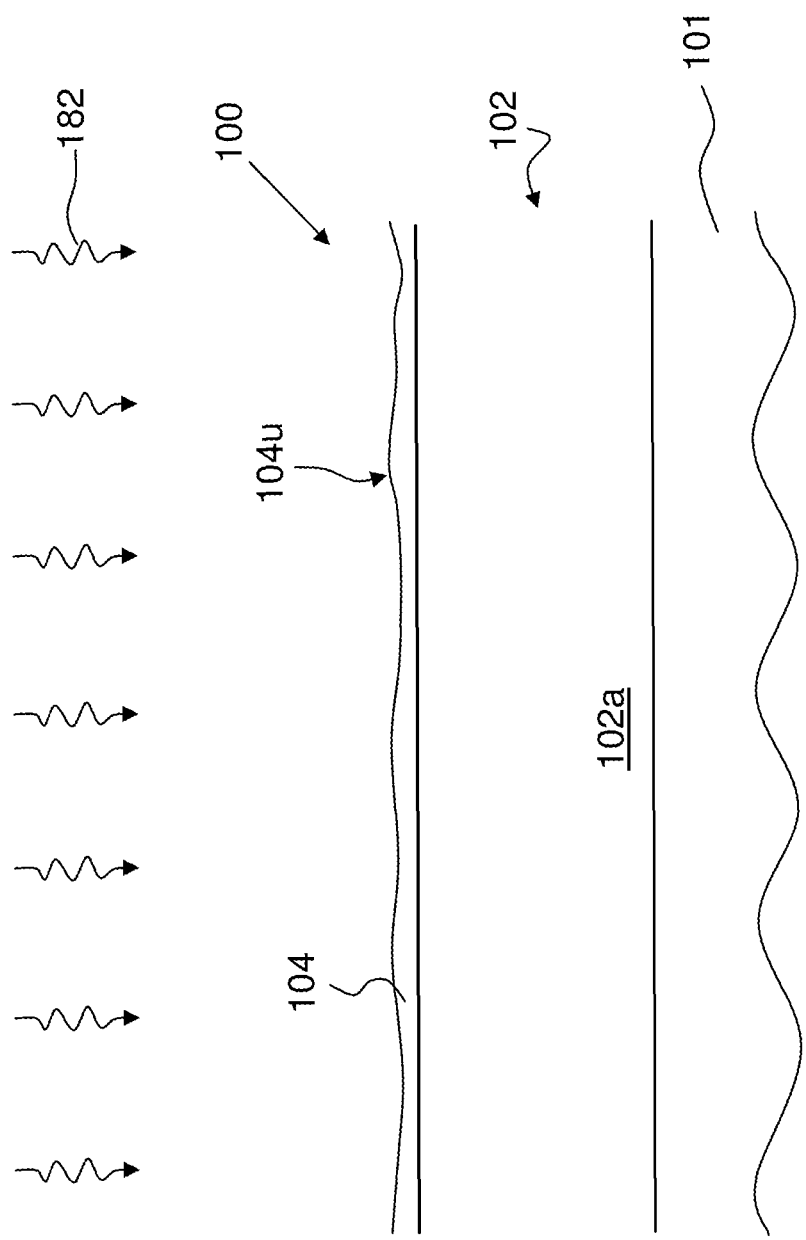

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be noted that, where appropriate, the reference numbers used in describing the various elements illustrated in FIGS. 2a-2e substantially correspond to the reference numbers used in describing the corresponding elements illustrated in FIGS. 1a-1c above, except that the leading numeral for corresponding features has been changed from a 1 to a 2. For example, semiconductor structure 100 corresponds to semiconductor structure 200, gate electrode 160 corresponds to gate electrode 260, semiconductor alloy layer 104 corresponds to semiconductor alloy layer 204, cleaning process 182 corresponds to cleaning process 282, and so on. Accordingly, the reference number designations used to identify some elements of the presently disclosed subject matter may be illustrated in FIGS. 2a-2e but may not be specifically described in the following disclosure. In those instances, it should be understood that the numbered elements shown in FIGS. 2a-2e which are not described in detail below substantially correspond with their like-numbered counterparts illustrated in FIGS. 1a-1c, and described in the associated disclosure set forth above.

Figure 2B:
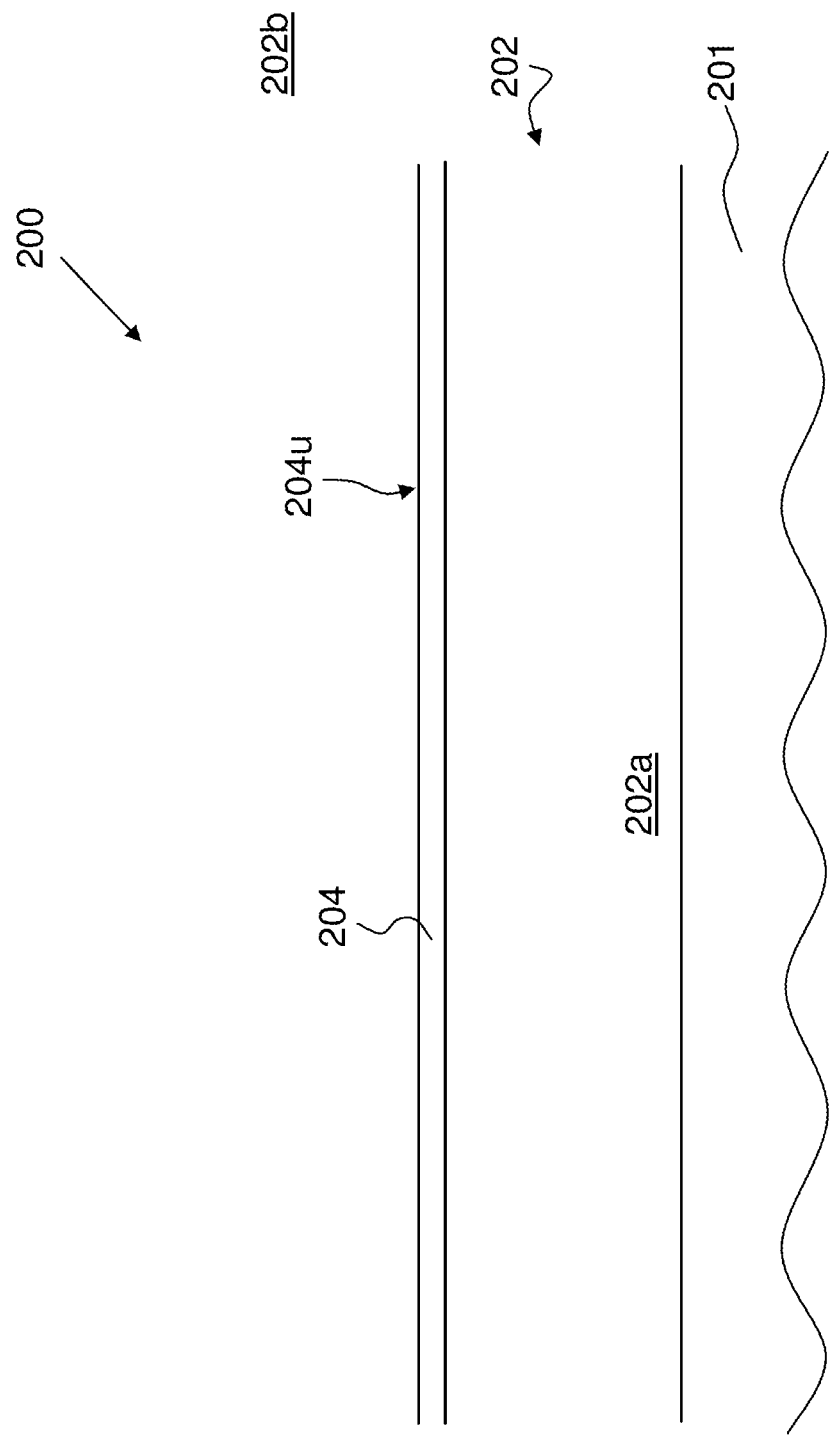
Figure 2D:
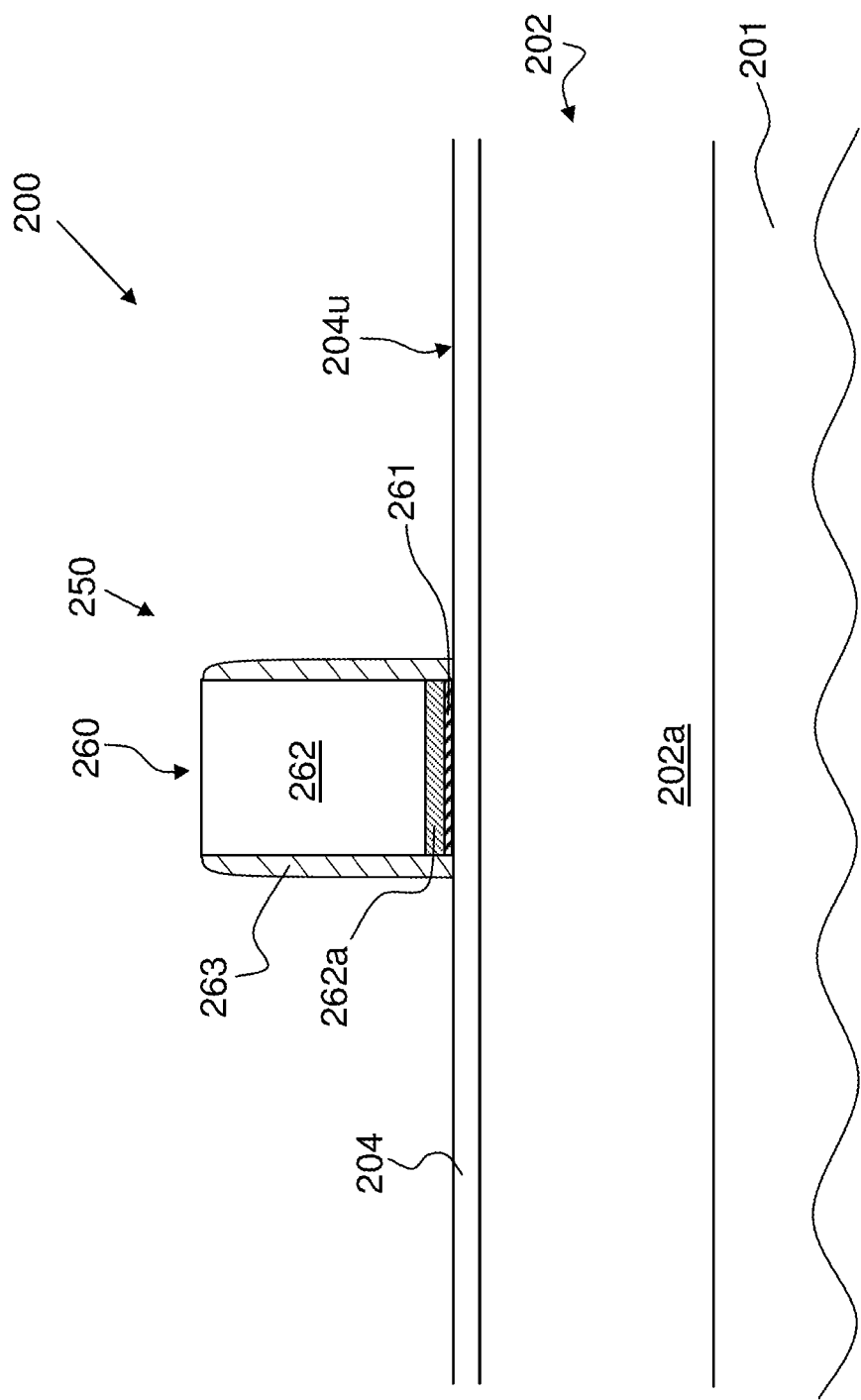
Figure 2E:
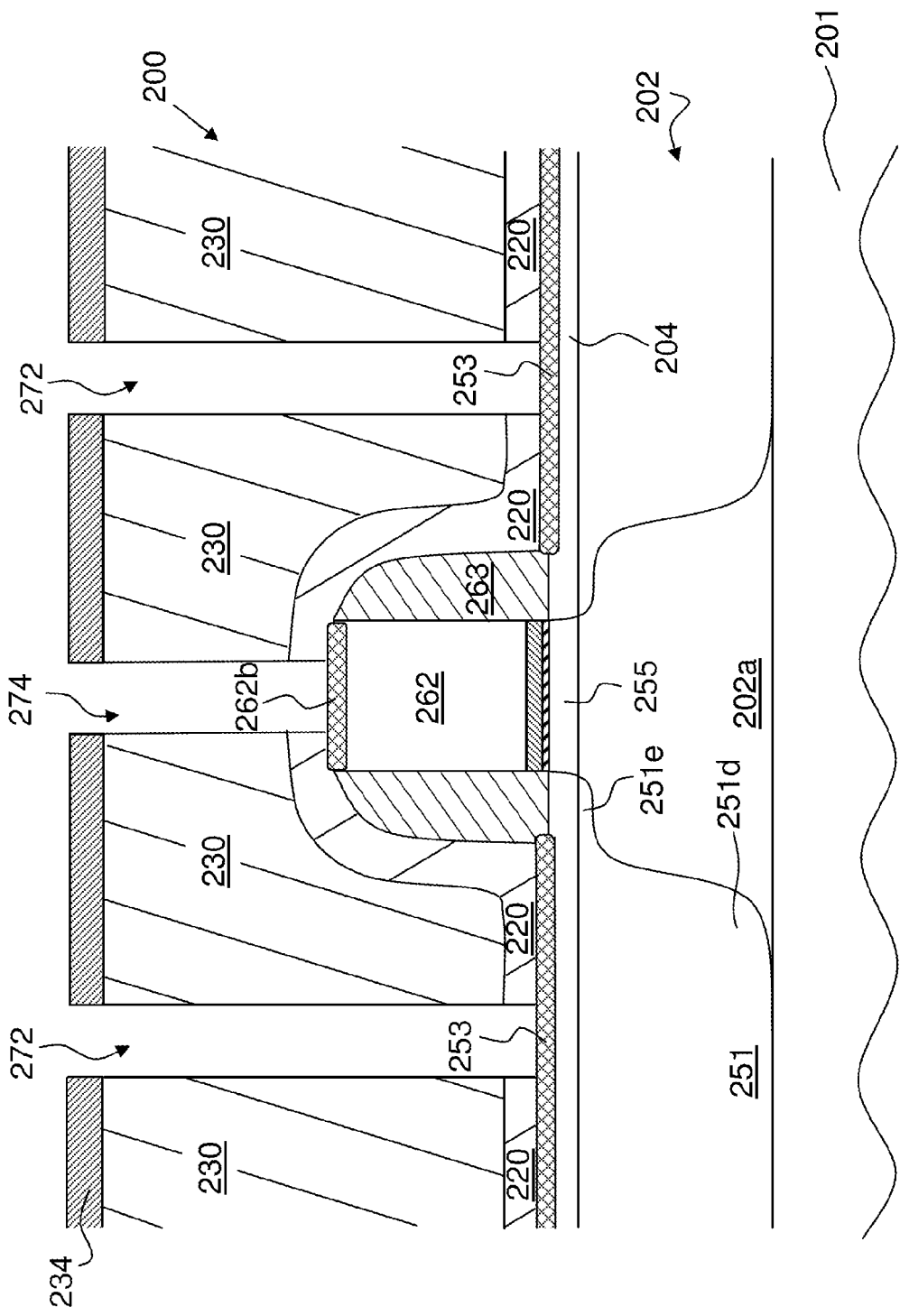
Figure 3A:
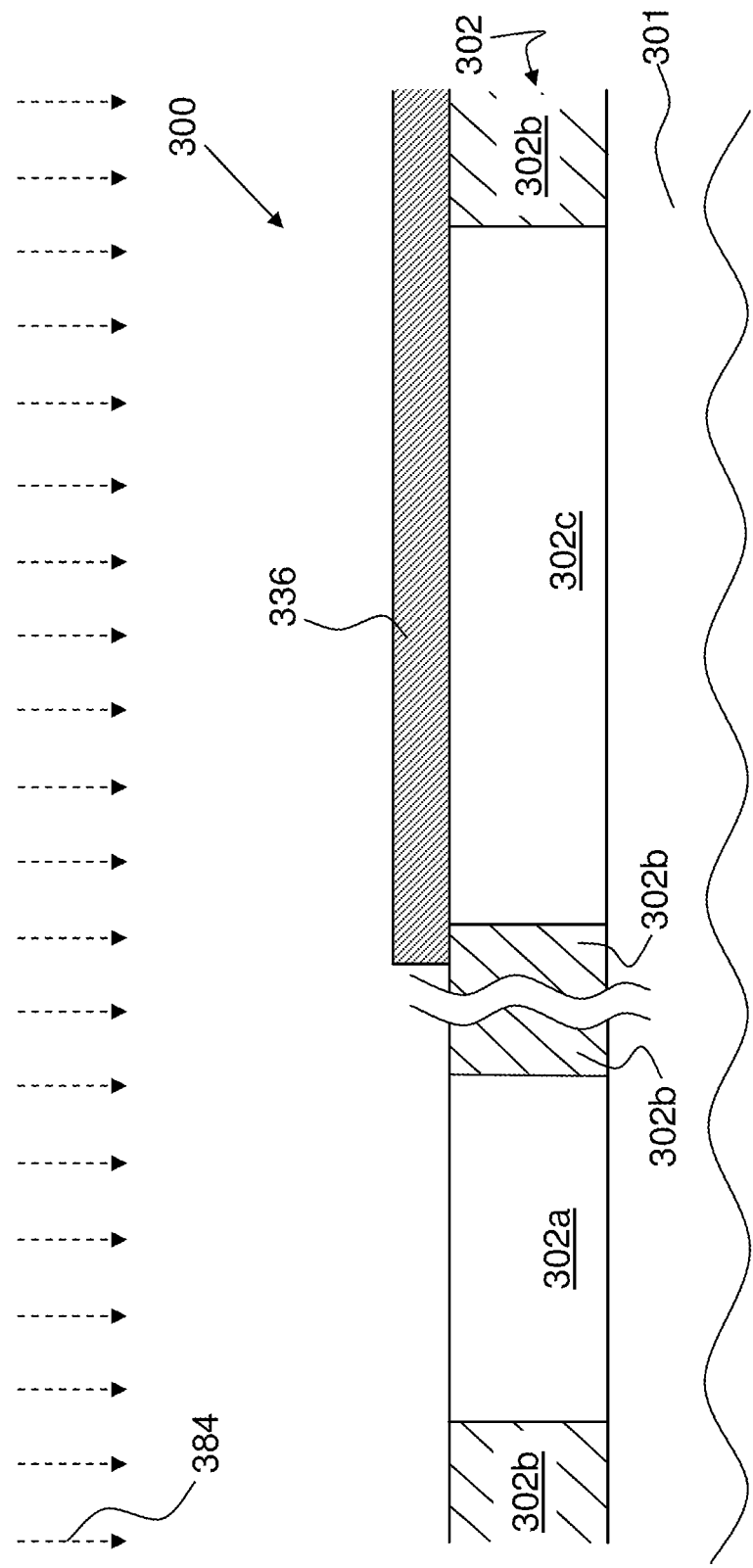
FIGS. 3a-3b schematically illustrate cross-sectional views of a semiconductor structure during consecutive manufacturing stages of a fabrication process flow according to a further embodiment of the present invention.
Figure 3B:
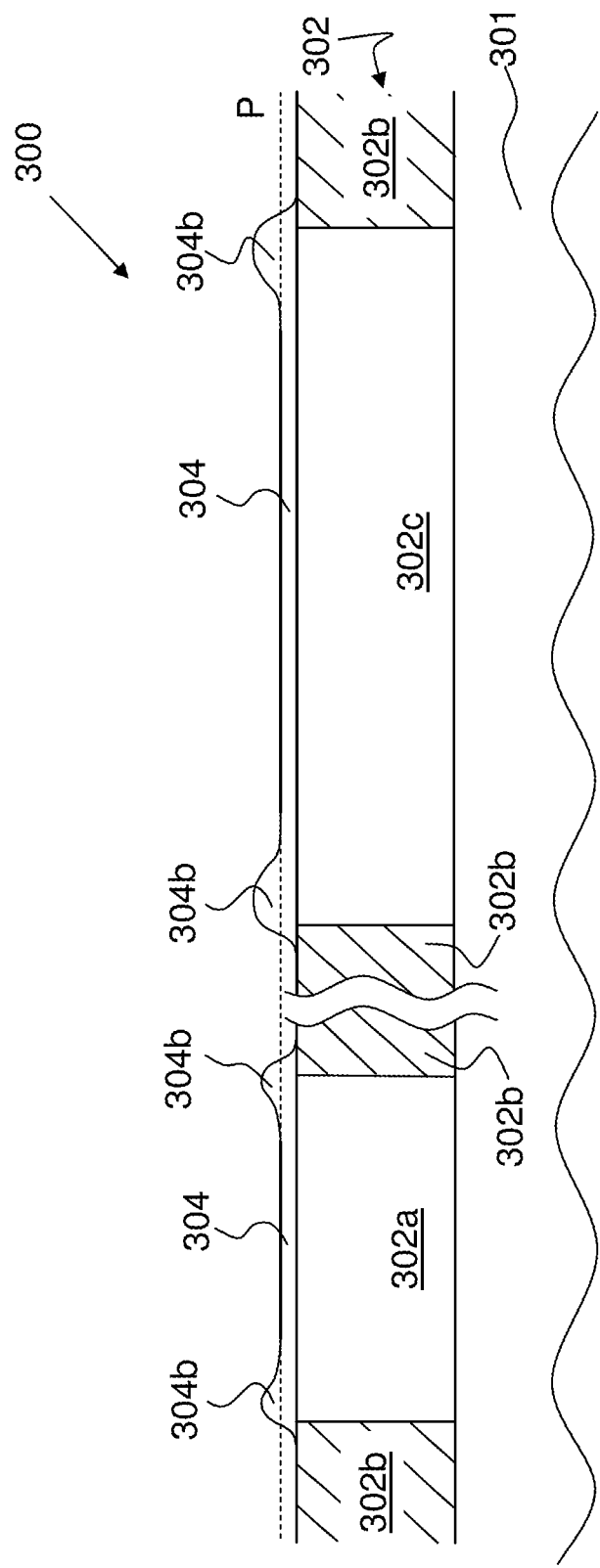

Analogously, reference numbers used in describing the various elements illustrated in FIGS. 3a and 3b substantially correspond to the reference numbers used in describing the corresponding elements illustrated in FIGS. 1a-1c and 2a-2e above, except that the leading numeral for corresponding features has been changed from a 1 or 2 to a 3. For example, semiconductor structure 100 corresponds to semiconductor structure 300, impurity implantation 284 corresponds to impurity implantation 384, semiconductor alloy layer 204 corresponds to semiconductor alloy layer 304, and so on. Where elements shown in FIGS. 3a and 3b are not described in detail, it should be understood that the description given for their corresponding elements with reference to FIGS. 1a-1c and 2a-2e is applicable to those elements shown in FIGS. 3a and 3b, unless otherwise noted.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor device 200 depicted in FIG. 2b, it should be understood that the semiconductor alloy layer 204 is formed "above" the substrate 201 and "on" the active region 202a of the semiconductor layer 202. Analogously. the semiconductor layer 202 is "below" or "under" the semiconductor alloy layer 204.

FIGS. 2a-2e show a semiconductor structure 200 and a method of fabrication thereof according to an embodiment of the present invention.

According to one embodiment of the invention, the semiconductor layer 202 comprises silicon. According to a specific embodiment, the semiconductor layer 202 comprises monocrystalline silicon.

The semiconductor structure 200 may be formed on a substrate 201, as explained above with reference to FIGS. 1a-1c. As indicated with reference to the device 100, the substrate 201, which may represent any appropriate carrier material, and the semiconductor layer 202 may form an SOI configuration or a bulk configuration, depending on the overall process and device requirements. Furthermore, a plurality of active regions may be laterally delineated by isolation regions. For convenience, a single active region 202a is illustrated in FIG. 2a. In the embodiment shown, the active region 202a may correspond to the active region of a P-channel transistor or of an N-channel transistor to be formed in and above the active region 202a. Active regions may be laterally delimited by separation regions (not shown). For example, shallow trench isolations may be formed in the semiconductor region 202 in order to define active regions 202a.

Although not shown in FIG. 2a, one or more implantations may have been carried out on active region 202a in order to define a well structure of the appropriate type. More specifically, if the FET to be formed in the semiconductor structure 200 is to be a P-channel FET, then an N-well structure is created by lightly implanting the active region 202a with N-type dopants. Conversely, if an N-channel FET is to be formed in the semiconductor structure 200, then P-type dopants are implanted in small doses into the active region 202a in order to define a P-well structure.

An ion implantation 284 is then performed onto the semiconductor layer 202. Ion implantation 284 may be carried out either before or after the well implantations. Furthermore, ion implantation 284 may be performed on a blank substrate 201, before forming the semiconductor layer 202 or before defining the active regions 202a.

Ion implantation 284 is carried out in order to introduce into semiconductor layer 202 impurity species capable of improving the quality of a semiconductor alloy layer 204 deposited after implantation 284 and shown in FIG. 2b. In particular, the impurities species implanted by implantation 284 achieve an essentially two-fold effect. On the one hand, the presence of the impurities implanted by means of process 284 decreases the growth rate of the semiconductor alloy layer 204, when this is epitaxially deposited onto the semiconductor layer 202. On the other hand, a semiconductor alloy layer 204 epitaxially grown onto a semiconductor layer 202 with implanted impurities shows much greater stability and resilience with respect to common surface cleaning procedures, e.g., wet and dry etch, compared to a semiconductor alloy layer 204 grown on a non-implanted crystalline semiconductor layer 202.

Impurity species implanted by means of implantation 284 may include one or more neutral species, i.e., one or more species not resulting in the formation of free electrical charge carriers in the semiconductor layer 202. Thus, according to an embodiment of the present invention, impurity species implanted by implantation 284 may include at least one of the following species: neon and argon. If the semiconductor layer 202 comprises silicon, germanium may also be implanted as a neutral species.

Alternatively, one or more species may be implanted by means of implantation 284 capable of affecting the threshold voltage of the FET to be formed in the semiconductor structure 200. Implanted species may either raise or lower the threshold voltage. For example, according to an embodiment of the invention, the impurity species implanted by implantation 284 may include at least one of fluorine or nitrogen. These species may affect the threshold voltage of a silicon-based transistor. Thus, according to this latter embodiment, impurity implantation 284 provides one with a further tool for adjusting the threshold voltage of a FET to a desired value.

It should be understood that by the term "species capable of affecting the threshold voltage of the FET" it is referred to a species which, when implanted into a semiconductor alloy layer of a given thickness, results in a variation of the threshold voltage of a FET due to a change in the band structure of the semiconductor alloy and not necessarily due to a thickness variation of the semiconductor alloy layer. However, it is here pointed out that even species termed "neutral" above have been observed to affect the threshold voltage of a FET when implanted into the channel semiconductor alloy layer. This is mainly due to the fact that these "neutral species" bring about a variation in the thickness of the semiconductor alloy layer which, in turn, results in a variation of the band structure of the layer.

Thus, according to a further embodiment, both neutral and threshold-voltage-changing species may be implanted by means of implantation 284. For example, implantation 284 may be performed in several steps by implanting one or more neutral species at some stages and one or more threshold-voltage-changing species at some other stages. Performing implantation 284 in two or more stages may be advantageous in order to compensate for the change of a transistor threshold voltage brought about by one implantation stage. For example, if a first implantation of a first species results in an increase of the threshold voltage, a second species may be subsequently implanted which is known to result in a decrease of the threshold voltage. In a more specific example, the first species may be a neutral species, whereas the second species may be a threshold-voltage-changing species.

The dose of impurity ions implanted by means of implantation 284 is preferably in the range of $10^{15}$ to $3 \times 10^{15}$ cm$^{-2}$. In general, the preferred dose depends on the species of the implanted ions. As a rule of thumb, the required dose decreases with increasing size of the implanted ions or atoms. Impurity ions are preferably implanted during implantation 284 at an energy in the range of about 5-10 keV.

Since impurity implantation 284 is performed at relatively high doses, implanted impurity ions may likely cause a significant number of damages to the crystalline lattice of semiconductor layer 202. Thus, an annealing step is advantageously performed immediately after implantation 284 has been carried out. The annealing step results in the semiconductor layer 202 to recover from implantation damage and in the crystalline lattice to be reformed. In particular, the exposed surface of the semiconductor layer 202 regains its original crystalline structure as a result of the annealing. After impurity implantation, the semiconductor structure 200 may be annealed at a temperature between about 650-1050° C.

It has been observed that, after annealing, implanted impurities in general occupy interstitial sites, rather than lattice sites in the crystalline structure of the semiconductor layer 202.

As shown in FIG. 2b, after performing impurity implantation 284 and, where needed, an annealing step, a semiconductor alloy layer 204 is deposited onto the semiconductor layer 202. According to an advantageous embodiment of the invention, the semiconductor alloy layer 204 comprises an SiGe alloy. For example, the semiconductor alloy layer 204 may comprise an SiGe alloy with a germanium concentration in the range of about 30-45%.

The semiconductor alloy layer 204 may be epitaxially grown on the semiconductor layer 202 by means of a well-established deposition technique. Some examples of epitaxial growth methods which can be used include: chemical vapor deposition (CVD), plasma-enhanced chemical vapor deposition (PECVD), atomic layer deposition (ALD), physical vapor deposition (PVD), molecular beam epitaxy (MBE) and the like. Preferably, a highly conformal deposition technique is used, so that a semiconductor alloy layer 204 may be formed having a thickness as homogeneous as possible. The semiconductor alloy layer 202 has preferably a thickness in the range of about 4-10 nm.

It has been found that, if equal amounts of material are deposited, growing a semiconductor alloy layer 204 on a semiconductor layer 202 which has undergone impurity implantation 284 results in the thickness of the semiconductor alloy layer 204 being smaller than that of a semiconductor alloy layer 204 grown on a semiconductor layer 202 which has not previously received impurity implantation 284. In other words, the presence of the impurity ions implanted into the semiconductor layer 202 causes the rate of growth of the semiconductor alloy layer 204 to decrease. In general, this effect is all the more pronounced the higher the dose of implanted impurities is.

Figure 4A:
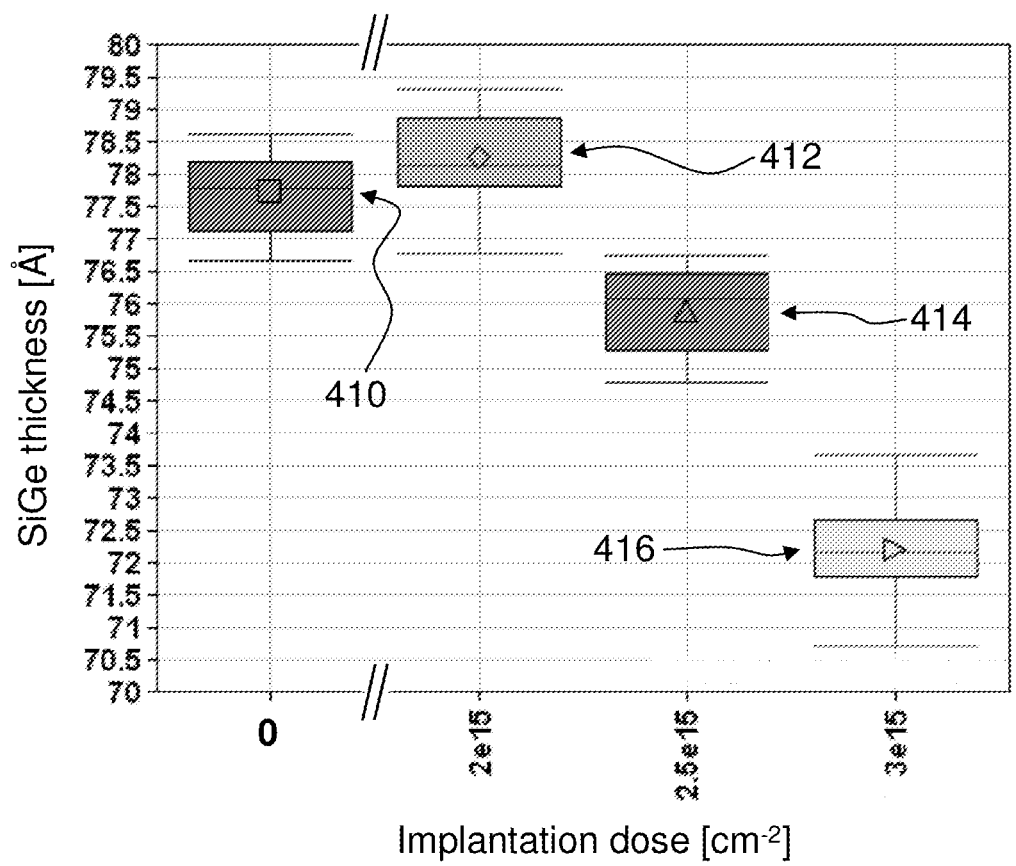
FIG. 4a shows a graph, wherein the thickness of the SiGe layer is plotted as a function of the dose of implanted impurities.

FIG. 4a shows the results of a series of experiments, wherein the same amount of SiGe alloy has been deposited onto crystalline silicon substrates implanted with impurity ions at different doses. The species implanted was in all cases fluorine. The silicon substrates used for the experiments had all equal features and surface characteristics, except for the dose of implanted impurities.

Point 410 in the plot represents the thickness distribution of a semiconductor alloy layer 204 deposited on a semiconductor layer 202 free from implanted impurities. Point 412 shows that the thickness of an SiGe layer deposited after a fluorine implantation with a dose of $2 \times 10^{15}$ cm$^{-2}$ was not distinguishable within the experimental error from the thickness of an SiGe layer deposited onto a substrate free from impurities. However, as shown by point 414, an increase of the dose of implanted fluorine up to $2.5 \times 10^{15}$ cm$^{-2}$ caused the thickness of the SiGe layer grown after the implantation to be smaller by over 1 Å than the thickness of the SiGe layer grown without any prior impurity implantations (point 410). By further increasing the dose of implanted fluorine up to $3 \times 10^{15}$ cm$^{-2}$ (point 416), the thickness of the SiGe layer is considerably reduced by about 10% with respect to the thickness of the SiGe layer grown in the absence of implanted impurities (point 410).

The experiments summed up by the plot of FIG. 4a clearly prove that, the deposited amounts being equal, the thickness of the semiconductor alloy layer 204 decreases with increasing doses of impurities implanted by means of implantation 284.

We now refer back to FIG. 2b. Thus, the growth rate of the semiconductor alloy layer 204 decreases in the presence of impurities implanted in the semiconductor alloy layer 204 before deposition of channel semiconductor alloy layer 204. This effect may arise from a deformation of the crystal lattice of the semiconductor alloy induced by the presence of the impurities which, as said above, preferably occupy interstitial positions in the crystal lattice of the substrate. Implanted impurities may also likely result in formation of defects in the crystal lattice of the semiconductor layer 202.

During a typical growth or deposition process, the species making up the semiconductor alloy layer 204, e.g., silicon and germanium, are mixed in the gas form and are adsorbed onto the surface of the substrate or of the semiconductor layer 202. Once adsorbed, the growing species may diffuse across the surface. It is very likely that the presence of defects or of stress-induced deformations in the crystal lattice of the substrate surface may affect the adsorption and/or diffusion of the growing species in a manner resulting in the growth rate being reduced. For example, the adsorption rate and/or the diffusion rate of the growing species may decrease if the substrate surface is under stress or if surface defects are present.

The effect of the growth rate of the channel semiconductor alloy being reduced due to the presence of implanted impurities may be exploited in order to grow by means of a single deposition process a semiconductor alloy layer 204, e.g., a channel SiGe alloy layer, having predetermined thicknesses in different portions of the semiconductor structure 200. For example, if the semiconductor alloy layer 204 is deposited onto a wafer surface, it might be desirable that the growth rate of the semiconductor alloy layer 204 differs depending on the portion of the wafer surface. For example, it might be advantageous to form a semiconductor alloy layer 204 growing slower when deposited on areas corresponding to SRAMs and faster when deposited onto areas occupied by CPUs. This could compensate for the problem discussed above related to the thickness variation observed when depositing a semiconductor alloy layer 204 onto a device surface with many active areas with different sizes.

Thus, according to one embodiment, impurity implantation 284 is performed in the presence of a mask. Preferably, the mask covers the areas where the growth rate of the semiconductor alloy layer 204 is to be higher and leaves uncovered those areas where the growth rate of the semiconductor alloy layer 204 is preferably lower. Thus, the areas exposed by the mask receive the implanted impurities, whereas the screened areas remain unaltered by impurity implantation 284. After impurity implantation 284 has been performed in the presence of the mask, the semiconductor alloy layer 204 is epitaxially grown onto the semiconductor layer 202, e.g., by means of one of the techniques listed above. Due to the different impurity concentrations in the semiconductor layer 202, the growth rate of the semiconductor alloy layer 204 is faster in correspondence to surface areas of the semiconductor layer 202 covered by the mask and slower in correspondence to surface areas of the semiconductor layer 202 left exposed by the mask.

It is also possible to perform more than one impurity implant 284. One or more than one implants 284 may be performed in the presence of a mask appropriately patterned so as to leave exposed predetermined portions of the surface of the semiconductor layer 202. Thus, impurities may be implanted at different concentrations in predetermined portions of the semiconductor layer 202, which results in the semiconductor alloy layer 204 having different growth rates in different portions of the semiconductor layer 202 depending on the impurity concentration.

It is pointed out that, thanks to the process flow defined above, it is possible to form a semiconductor alloy layer 204 having a desired thickness in a predetermined portion of a semiconductor device. This may be achieved by growing the semiconductor alloy layer 204 by means of a single deposition step using a well-established epitaxial growth technique. Thus, impurity implantation or implantations 284 makes it possible to locally adjust the thickness of the semiconductor alloy layer 204 by using a deposition technique known from the prior art. This is particularly advantageous, in that traditional deposition techniques may not easily be modified in order to obtain a film with an adjustable thickness depending on the position across the surface. In contrast, implantation processes are in general easy to perform and may cost-effectively be directed to predetermined areas of the sample.

According to an embodiment not shown in the figures, the sequence of impurity implantation 284, annealing and deposition of semiconductor alloy layer 204 is performed before forming the active regions 202a. According to this embodiment, impurity implantation 284 is performed on the bare semiconductor layer 202. Impurity implantation 284 may be performed according to any of the embodiments described above. Impurity implantation 284 may then be advantageously followed by an annealing step, as discussed above. After impurity implantation 284 and the annealing step have been carried out, the semiconductor alloy layer 204 is epitaxially deposited, again as described above. According to the embodiment being discussed, after deposition of the semiconductor alloy layer 204, the active region 202a is defined in the semiconductor layer 202. The active region 202a may be separated by adjacent active regions by isolation regions, as previously described. Where needed, one or more implants may thereafter be performed in order to define a P-well structure or an N-well structure, depending on whether an N-channel transistor or a P-channel transistor is to be formed in active regions 202a, respectively.

FIGS. 3a and 3b show a particular embodiment of the method illustrated with reference to FIGS. 2a and 2b. According to the embodiment shown in FIGS. 3a and 3b, a mask is used when performing the impurity implantation before depositing the semiconductor alloy layer. This last embodiment provides an example of an application of the claimed method to a semiconductor structure comprising at least two or a plurality of devices. The devices included in the semiconductor structures are typically FETs.

FIG. 3a shows a cross-sectional view of a semiconductor structure 300 wherein at least two active regions 302a and 302c, respectively, have been defined in the semiconductor layer 302. The semiconductor layer 302 preferably comprises monocrystalline silicon. Active regions 302a and 302c are separated by neighboring active regions by separation regions 302b. Separation regions 302b may, for example, be implemented as shallow trench isolations. Active regions 302a and 302c are adapted to form a portion of a respective semiconductor device, e.g., a transistor.

Active region 302a has a length (dimension along the horizontal direction in FIGS. 3a and 3b) which is considerably smaller than the length of active region 302c. For example, active region 302a may be included in an area of the semiconductor structure 300 in which an SRAM is arranged, whereas active region 302c may be included in an area of the semiconductor structure 300 containing a CPU. Due to the size difference between active regions, a semiconductor alloy layer deposited onto the semiconductor structure 300 would be thicker in the portion deposited onto active region 302a than in the portion deposited onto active region 302c. As said above, this effect is also known as pull-up effect or mushroom head.

In order to obviate this problem, according to the embodiment being discussed, an impurity implantation 384 is performed onto the semiconductor structure 300 in the presence of a mask 336. Implantation 384 may be performed in any of the ways described above in relation to implantation 284. Implantation 384 is performed before depositing a semiconductor alloy layer onto the surface of the semiconductor structure 300.

The mask 336 preferably covers those areas of the surface of the semiconductor structure 300 corresponding to areas of the surface with a lower rate of growth of a semiconductor alloy layer to be deposited after performing impurity implantation 384. Symmetrically, the mask 336 preferably leaves exposed those surface areas of the semiconductor structure 300 where the growth rate of the semiconductor alloy layer is in general higher. In the exemplary embodiment shown in FIG. 3a, the mask 336 covers the larger active region 302c and leaves exposed the smaller active region 302a.

The parameters (e.g., impurity species, dose, implantation energy, etc.) of impurity implantation 384 may be adjusted so that the portion of the semiconductor alloy layer grown onto the surface areas of the semiconductor structure 300 left exposed by the mask 336 has a desired thickness. In general, after performing implantation 384, the growth rate of the semiconductor alloy layer decreases with respect to the rate observed during a growth process performed without previously carrying out implantation 384. Thus, by choosing appropriate parameters of implantation 384, the growth rate of the semiconductor alloy layer may be adjusted at will in the implanted surface areas.

After performing impurity implantation 384, the mask 336 is removed and the semiconductor alloy layer 304 is deposited. The semiconductor alloy layer 304 preferably comprises an SiGe alloy. The semiconductor alloy layer 304 is preferably deposited by means of a single deposition process using, for example, one well-established technique, such as one of those referred to above.

According to the embodiment shown in FIG. 3b, the parameters of impurity implantation 384 are adjusted so that the portions of the semiconductor alloy layer 304 grown on active region 302a and active region 302c have an equal thickness. In this manner, a uniform semiconductor alloy layer 304 may be grown having a substantially constant thickness across the whole surface of the semiconductor structure 300.

FIG. 3b also shows that the surface of the portion of semiconductor alloy layer deposited on active region 302a lies on substantially the same plane P as the surface of the portion of the semiconductor alloy layer deposited on active region 302c. Also shown in FIG. 3b are the swollen portions 304b of semiconductor alloy layer 304 including bumps formed in correspondence with the boundary between active regions 302a, 302c and separation regions 302b. Thanks to the selective implantation, the growth rate of the portion of semiconductor alloy layer 304 deposited onto active region 302a is reduced with respect to the growth rate of the portion deposited onto active region 302c. This prevents bumps 304b formed at opposite sides of active region 302a from interacting with each other and giving rise to the undesirable mushroom head shape of the semiconductor alloy layer 304.

Thus, by using a well-established single-step deposition technology, a highly conformal uniform semiconductor alloy layer 304 may be grown on the surface of a semiconductor structure containing active regions of different sizes.

If desired, implantation 384 may be performed while using mask 336 in such a way that predetermined portions of the semiconductor alloy layer have a greater thickness than others.

FIG. 2c shows a stage in the semiconductor structure manufacturing flow subsequent to that shown in FIG. 2b. It is pointed out that the manufacturing stages shown in FIGS. 2c-2e may also follow the fabrication stages according to the embodiment shown in FIGS. 3a and 3b.

As shown in FIG. 2c, after depositing the semiconductor alloy layer 204, one or more cleaning procedures 282 are performed in order to clean the surface of the semiconductor structure 200. As said above, cleaning procedure 282 may include any combination of cleaning techniques known in the state of the art. For example cleaning 282 may include one or more wet etches. Alternatively or additionally, cleaning 282 may comprise a dry etch. As said above, cleaning procedure 282 is performed in order to favor formation of a good quality gate insulating layer on the surface of the semiconductor alloy layer 204.

It has been found that the presence of impurities implanted in the semiconductor layer 202 with implantation 284 results in the thickness fluctuation of the semiconductor alloy layer 204 after cleaning 282 being considerably reduced with respect to a semiconductor alloy layer 204 deposited on a semiconductor layer 202 not undergoing implantation 284.

Figure 4B:
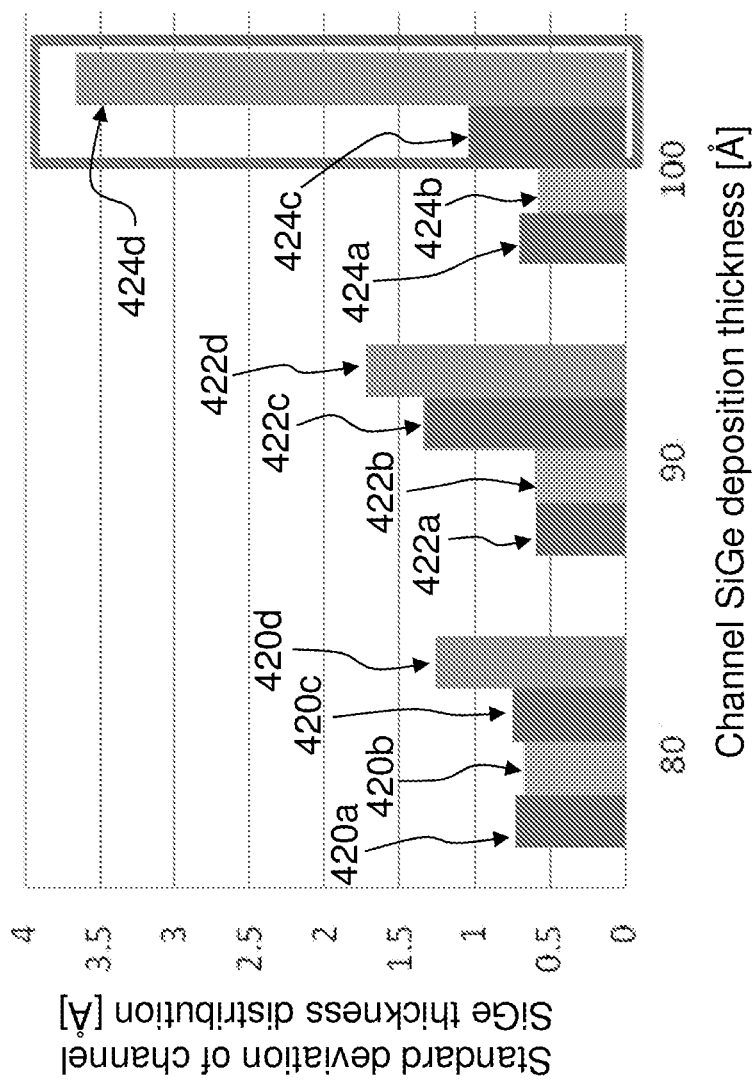
FIG. 4b shows a bar chart comparing the thickness fluctuation of SiGe layers according to the present invention with that of SiGe layers according to the prior art.

The bar chart shown in FIG. 4b compares the thickness fluctuations of semiconductor alloy layers having different thicknesses and grown in the presence and in the absence of impurities implanted by implantation 284 or 384. The experiments were carried out by depositing an SiGe alloy layer onto a crystalline silicon substrate at different thicknesses.

The vertical axis reports the standard deviation of the thickness distribution expressed in Ångstroms. Bars 420a-420d relate to semiconductor alloy layers obtained after growing films of a thickness of 80 Å, bars 422a-422d relate to semiconductor alloy layers obtained after growing films of a thickness of 90 Å, and bars 424a-424d relate to semiconductor alloy layers obtained after growing films of a thickness of 100 Å. Bars 420a (420b), 422a (422b), and 424a (424b) relate to semiconductor alloy layers grown after (grown without prior) implantation 284 or 384 and show the thickness distribution of the films as deposited, i.e., before cleaning 282 has been performed. Bars 420c (420d), 422c (422d), and 424c (424d) relate to semiconductor alloy layers grown after (grown without prior) implantation 284 or 384 and show the thickness distribution of the films after cleaning 282 has been performed.

As shown in FIG. 4b, implantations 284 or 384 do not dramatically affect the thickness distribution of the semiconductor alloy layers immediately after deposition as compared, for example, to a layer of the same thickness grown without previously performing implantations 284 or 384. However, the effect of the implanted impurities is evident after performing cleaning procedures 282. At all deposited thicknesses, the thickness distribution of the semiconductor alloy layer turned out to be considerably smaller if implantations 284 or 384 had been previously performed, than in the case of deposition carried out without previously performing implantations 284 or 384. In particular, in the case of a deposited thickness of 100 Å, implantation 284 or 384 may reduce the thickness distribution of the semiconductor alloy layer after cleaning 282 by about 70%, as shown by bars 424c and 424d.

Thus, impurity implantations 284 and 384, besides decreasing the growth rate of the semiconductor alloy layer 204 deposited onto the semiconductor layer 202, cause the semiconductor alloy layer 204 to be more resilient and less sensitive to surface cleaning procedures 282 performed after deposition of the semiconductor alloy layer 204.

By exploiting this effect, the present invention provides a convenient and cost-effective method for improving the uniformity of the semiconductor alloy layer 204, e.g., an SiGe alloy film, after all surface cleaning procedures following layer deposition have been accomplished. This is highly desirable since, although the thickness uniformity immediately after deposition may be relatively well controlled by using, for example, a highly conformal growth method, it has been so far impossible to reduce the thickness distribution of the channel semiconductor alloy layer after cleaning. A more uniform semiconductor alloy layer, e.g., an SiGe layer, results in a threshold voltage of the FET controllable with a higher degree of precision and in the performances of the FET to improve.

After cleaning 282 has been carried out, the manufacturing of semiconductor structure 200 continues in the conventional manner described with reference to FIG. 1c.

FIG. 2d shows the semiconductor structure 200 during a stage in the manufacturing process subsequent to that shown in FIG. 2c. After performing cleaning 282, a gate structure 260 of a transistor 250 may be formed, as previously described with reference to FIG. 1c. According to one embodiment, the transistor 250 is a FET.

The gate electrode structure 260 includes a gate electrode material 262, which could comprise silicon, for example polycrystalline silicon. Furthermore, the gate electrode structure 260 is provided with a dielectric insulation layer 261 between the gate electrode material 262 and the channel region of the transistor in the active region 202a of the semiconductor layer 202. The gate electrode structure 260 is preferably formed according to an HKMG technology and, in particular, according to the gate-first HKMG approach.

Thanks to implantation 284, the semiconductor alloy layer 204 onto which the gate structure 260 of transistor 250 is formed does not exhibit significant thickness variations across the active region 202a. In particular, the semiconductor alloy layer 204 exposes a surface 204u which is substantially flat, even after cleaning process 282 has been performed. Thus, the gate structure 260 may be formed on a uniform, substantially flat semiconductor alloy layer 204, in contrast to the method known from the prior art and shown in FIG. 1c.

FIG. 2e shows the semiconductor structure 200 in an advanced stage of the manufacturing process following the stage shown in FIG. 2d.

After forming the gate electrode structure 260, one or more implantation processes may be performed so as to form highly doped extension regions 251e included in the source or drain regions 251, as shown in FIG. 2e. Thus, the channel region 255 of the transistor 250 is defined. The channel region 255 comprises a portion of the semiconductor alloy layer 204.

Subsequently, spacer structure 263 of the gate electrode 260 may be broadened and a second implantation may be performed in order to define deep regions 251d. Thereafter, an appropriate anneal processes may be applied so as to re-crystallize implantation-induced damage and activate the doping agents. This completes the formation of source and drain regions 251 of transistor 250.

A refractory metal layer (not shown) is then deposited onto the surface of the semiconductor structure 200. The refractory metal preferably comprises nickel. After depositing the refractory metal layer, a silicidation process (e.g., a heat treatment) is applied, resulting in formation of metal semiconductor layers 262b on the upper edge of the gate electrode 260 and metal semiconductor layer 253 in correspondence to the source/drain regions 251. Metal semiconductor layers 253 and 262b are preferably nickel silicide layers, although they may contain other species.

As shown in FIG. 2e, after formation of silicide layers 253 and 262b, a stressed material layer 220 is deposited onto the surface of the semiconductor structure 200. Subsequently, a UV curing process is applied at a temperature ranging from 400-500° C.

An interlayer dielectric layer 230 is then deposited onto the stressed material layer 220. An etching process is then applied, for example, through a patterned mask 234, in order to form via openings 272 and 274. Openings 272 expose predetermined portions of the metal semiconductor layer 253 contacting the source and drain regions 251. On the other hand, via openings 274 expose predetermined portions of the metal semiconductor layer 262b contacting the gate electrode material 262.

Finally, via openings 272 and 274 may be filled with a metal, for example tungsten, so as to form electrical contacts to the source and drain regions and to the gate electrode material of the transistor 250.

The present disclosure enables improvement of a thin semiconductor alloy layer epitaxially grown on top of a crystalline semiconductor layer. The present disclosure relies on an implantation of appropriate impurity species before performing deposition of the semiconductor alloy film. The implanted species cause the semiconductor alloy layer to be less unstable to wet and dry etches performed on the device surface after deposition. Thus, after performing the required cleaning after depositing the semiconductor alloy film, the thickness uniformity of the semiconductor alloy film may be substantially increased if the film is deposited after performing the implantation. On the other hand, some implanted impurities have been found to decrease the growth rate of the semiconductor alloy layer. Thus, by selectively implanting appropriate impurities in predetermined portions of a wafer, a single deposition step may be used in order to form a semiconductor alloy layer with a thickness which may be locally adjusted at will.

The present invention is particularly advantageous in, although not limited to, the fabrication of FETs including a channel SiGe layer used for modulating the work function of the transistor. This is required, for example, with implementations using an HKMG technology, and, particularly, the gate-first HKMG approach, starting from the 32 nm technology. The SiGe layer is also advantageously used for introducing a compressively stressed component in the channel region of a P-channel FET. However, the present application is neither restricted to sub-45 nm technologies nor to the HKMG approach, but may be applied to all semiconductor fabrication methods.

The claimed sequence of impurity implantation followed by epitaxial growth of the semiconductor alloy layer may be performed at different stages during a FET or a MOSFET fabrication flow. For instance, the sequence may be performed as a very initial stage in the manufacturing stage on a blank wafer, before defining the active regions and the separation regions. Alternatively, the sequence may be performed after defining the active regions and before forming the gate electrode.

It should be understood that the claimed invention is not limited to transistors including a semiconductor alloy layer, e.g., an SiGe layer, in the channel region. Conversely, the invention may be applied to all those semiconductor devices whose fabrication flow requires an epitaxial growth of a semiconductor alloy layer on a semiconductor surface, e.g., growth of an SiGe layer on a silicon surface. For instance, the invention may be applied to sandwiched structures such as the Si—SiGe—Si technology. Moreover, the invention may be advantageously practiced in the context of SiGe devices, provided that an SiGe layer is to be epitaxially deposited onto a semiconductor surface, e.g., onto an Si surface.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor structure, comprising:
   providing a semiconductor layer;
   implanting impurity ions into said semiconductor layer wherein the species of said implanted impurity ions comprises at least one of neon, argon and germanium;
   forming a semiconductor alloy layer onto an upper surface of said semiconductor layer after performing said impurity ion implantation;
   cleaning an upper surface of said semiconductor alloy layer; and
   forming a gate structure above the cleaned upper surface of said semiconductor alloy layer.

2. The method of claim 1, wherein said impurity ions are implanted in the presence of a mask screening predetermined surface portions of said semiconductor layer.

3. The method of claim 1, further comprising:
   defining an active region in said semiconductor layer; and
   forming a well structure in said active region of said semiconductor layer.

4. The method of claim 1, wherein said cleaning comprises a wet etch.

5. The method of claim 1, wherein said cleaning comprises a dry etch.

6. The method of claim 1, wherein said gate electrode is formed according to the gate-first high-k/metal gate approach.

7. The method of claim 1, further comprising forming a drain and a source region adjacent said gate structure so as to define a transistor channel region between said source region and said drain region.

8. The method of claim 7, wherein said channel region of said transistor comprises a portion of said semiconductor alloy layer.

9. The method of claim 1, wherein said semiconductor layer comprises crystalline silicon.

10. The method of claim 1, wherein said semiconductor alloy layer comprises an SiGe alloy.

11. The method of claim 1, wherein said semiconductor alloy layer has a thickness in the range of 4-10 nm.

12. The method of claim 1, wherein said semiconductor alloy layer is formed by means of an epitaxial deposition onto said surface of said semiconductor layer.

13. The method of claim 1, wherein the species of said implanted impurity ions comprises a species capable of affecting the threshold voltage level of said transistor structure.

14. The method of claim 1, wherein said impurity ions are implanted at an energy in the range of 5-10 keV.

15. The method of claim 1, wherein said step of forming said semiconductor alloy layer comprises epitaxially growing said semiconductor alloy layer onto said surface of said semiconductor layer.

16. The method of claim 1, wherein the implantation dose when implanting said impurity ions is in the range of $10^{15}$ to $3\times10^{15}$ cm$^{-2}$.

17. The method of claim 1, further comprising annealing said transistor structure after implanting said impurity ions and before forming said semiconductor alloy layer.

18. The method of claim 17, wherein said annealing is performed at a temperature in the range of about 650-1050° C.

19. A semiconductor structure, comprising:
   a semiconductor layer;
   at least a first and a second active region formed in said semiconductor layer and adapted to form part of a first and a second device, respectively, the size of said first active region being smaller than the size of said second active region, an entirety of said first active region comprising implanted impurities of a predetermined species while an entirety of said second active region is substantially free of said implanted impurities, wherein said impurity species comprise at least one of neon, argon, germanium, fluorine and nitrogen;
   a semiconductor alloy layer epitaxially formed on said semiconductor layer, the portion of said semiconductor alloy layer formed onto said first active region having a thickness substantially equal to the thickness of the portion of said semiconductor alloy layer formed onto said second active region;
   a first transistor formed partly in and partly on top of said first active region comprised of said implanted impurities, a first portion of said semiconductor alloy layer being included in a channel region of said first transistor; and
   a second transistor formed partly in and partly on top of said second active region that is substantially free of said implanted impurities, a second portion of said semiconductor alloy layer being included in a channel region of said second transistor.

20. A method of forming a transistor structure, comprising:
   providing a semiconductor layer;
   performing an ion implant process to implant impurity ions into said semiconductor layer, wherein said ion implant process is performed using an implantation dose of at least $2\times10^{15}$ cm$^{-2}$ and wherein the species of said implanted impurity ions comprises at least one of neon, argon and germanium;
   after performing said ion implant process, performing an anneal process on said transistor structure;
   after performing said anneal process, performing an epitaxial deposition process to form a semiconductor alloy layer onto an upper surface of said semiconductor layer;
   cleaning an upper surface of said semiconductor alloy layer; and
   forming a gate structure above the cleaned upper surface of said semiconductor alloy layer.

21. The method of claim 20, wherein said anneal process is performed at a temperature in the range of about 650-1050° C.

22. The method of claim 20, wherein said impurity ions are implanted in the presence of a mask screening predetermined surface portions of said semiconductor layer.

23. A method of forming a transistor structure, comprising:
providing a semiconductor layer;
implanting impurity ions into said semiconductor layer, wherein the species of said implanted ions comprises at least one of fluorine or nitrogen;
forming a semiconductor alloy layer onto an upper surface of said semiconductor layer after performing said impurity ion implantation;
cleaning an upper surface of said semiconductor alloy layer; and
forming a gate structure above the cleaned upper surface of said semiconductor alloy layer.

24. A method of forming a transistor structure, comprising:
providing a semiconductor layer;
performing an ion implant process to implant impurity ions into said semiconductor layer, wherein said ion implant process is performed using an implantation dose of at least $2\times10^{15}$ cm$^{-2}$ and wherein the species of said implanted ions comprises at least one of fluorine or nitrogen;
after performing said ion implant process, performing an anneal process on said transistor structure;
after performing said anneal process, performing an epitaxial deposition process to form a semiconductor alloy layer onto an upper surface of said semiconductor layer;
cleaning an upper surface of said semiconductor alloy layer; and
forming a gate structure above the cleaned upper surface of said semiconductor alloy layer.

* * * * *